United States Patent
Keller

(10) Patent No.: US 8,872,019 B2
(45) Date of Patent: Oct. 28, 2014

(54) PHOTOVOLTAIC MODULE COMPRISING PLASTICIZED INTERMEDIATE LAYER FILMS HAVING HIGH RADIATION TRANSMISSION

(75) Inventor: Uwe Keller, Bonn (DE)

(73) Assignee: Kuraray Europe GmbH, Frankfurt (DE)

( * ) Notice: Subject to any disclaimer, the term of this patent is extended or adjusted under 35 U.S.C. 154(b) by 414 days.

(21) Appl. No.: 13/257,007

(22) PCT Filed: Mar. 15, 2010

(86) PCT No.: PCT/EP2010/053250
§ 371 (c)(1),
(2), (4) Date: Nov. 17, 2011

(87) PCT Pub. No.: WO2010/106000
PCT Pub. Date: Sep. 23, 2010

(65) Prior Publication Data
US 2012/0067404 A1 Mar. 22, 2012

(30) Foreign Application Priority Data
Mar. 18, 2009 (DE) .................. 10 2009 001 629

(51) Int. Cl.
*H01L 31/048* (2014.01)
*C08L 59/00* (2006.01)
*C08K 5/3435* (2006.01)
*B32B 17/10* (2006.01)
*C08K 5/00* (2006.01)
*C08K 5/103* (2006.01)

(52) U.S. Cl.
CPC ......... *B32B 17/10761* (2013.01); *C08K 5/3435* (2013.01); *Y02B 10/12* (2013.01); *B32B 17/10688* (2013.01); *C08K 5/0016* (2013.01); *Y02E 10/50* (2013.01); *B32B 17/10678* (2013.01); *C08K 5/103* (2013.01); *H01L 31/048* (2013.01)
USPC .......................................... 136/251; 524/543

(58) Field of Classification Search
None
See application file for complete search history.

(56) References Cited

U.S. PATENT DOCUMENTS

| 5,618,863 | A | 4/1997 | D'Errico et al. | |
|---|---|---|---|---|
| 5,650,019 | A | 7/1997 | Yamada et al. | |
| 6,353,042 | B1 | 3/2002 | Hanoka et al. | |
| 2005/0079363 | A1* | 4/2005 | Hoss et al. | 428/437 |
| 2007/0215205 | A1 | 9/2007 | Thomsen et al. | |
| 2009/0264288 | A1 | 10/2009 | Jikihara | |
| 2010/0009172 | A1* | 1/2010 | Morikawa et al. | 428/328 |
| 2011/0232735 | A1* | 9/2011 | Bizet et al. | 136/256 |

FOREIGN PATENT DOCUMENTS

| DE | 40 24 330 A1 | | 2/1992 |
|---|---|---|---|
| DE | 10162338 A1 | * | 7/2003 |
| DE | 10 2004 000 026 A1 | | 2/2006 |
| EP | 1 920 941 A1 | | 5/2008 |
| WO | WO 2009101343 A1 | * | 8/2009 |

OTHER PUBLICATIONS

Machine Translation of DE 10 2004 000 026 (orginal reference provided by Applicant).*
Univul 4050 Information Sheet.*
English Translation of PCT International Preliminary Report on Patentability issued Sep. 20, 2011 in International Application No. PCT/EP2010/053250.
International Search Report of PCT/EP2010/053250 (May 27, 2010).

* cited by examiner

*Primary Examiner* — Ling Choi
*Assistant Examiner* — Catherine S Branch
(74) *Attorney, Agent, or Firm* — Millen, White, Zelano & Branigan, P.C.

(57) ABSTRACT

The invention relates to the use of plasticizer-containing, polyvinyl acetal-based films that have a UV transmission of more than 35% to manufacture photovoltaic modules.
The films preferably have a volume resistivity of more than 1E11 Ohm*cm in an ambient climate of 85% rH/23° C.
The photovoltaic modules can be used as façade elements, roof surfaces, conservatory paneling, acoustic barriers, balcony or curtain wall panels, or as elements in glazed surfaces.

18 Claims, No Drawings

PHOTOVOLTAIC MODULE COMPRISING PLASTICIZED INTERMEDIATE LAYER FILMS HAVING HIGH RADIATION TRANSMISSION

TECHNICAL FIELD

The invention relates to the production of photovoltaic modules using plasticiser-containing films based on polyvinyl acetal having a radiation transmission in the UV range.

PRIOR ART

Photovoltaic modules consist of a photosensitive semiconductor layer that is provided with a transparent covering as a protection against external effects. Monocrystalline solar cells or supported polycrystalline, thin semiconductor layers may be used as photosensitive semiconductor layer. Thin-film solar modules consist of a photosensitive semiconductor layer applied to a substrate, such as a transparent sheet or a flexible support film, by means of for example evaporation coating, gas phase deposition, sputtering, or wet deposition.

Both systems are often laminated between a glass panel and a rigid back covering panel made for example of glass or plastics by means of a transparent adhesive.

The transparent adhesive must completely enclose the photosensitive semiconductor layer and its electrical connecting wires, must be UV stable and insensitive to moisture, and must be completely bubble-free after the lamination process.

Plasticiser-containing films based on polyvinyl acetals such as the polyvinyl butyral (PVB) known from laminate glass production are being used more and more frequently as the transparent adhesive system for photovoltaic modules. The solar cell units are covered with one or more PVB films and these are then bonded with the desired covering materials under increased pressure and temperature to form a laminate.

As a rule, light protection agents are widely used in polymer materials such as plastics and paints to provide protection against harmful UV radiation. They may be roughly divided into two classes depending on the different protection mechanisms used: UV absorbers, which absorb UV radiation and ultimately neutralise it by converting it into heat energy, and light stabilisers, which interrupt the damaging radical reactions triggered in polymer materials by UV radiation.

The most commercially important UV absorbers are derivatives of benzophenone, of benzotriazole, and of cyanoacrylates, the benzotriazoles most often demonstrating the best long-term stability. The group of light stabilisers essentially includes the "HALS" (sterically hindered amines) or sterically hindered aminoethers (NOR-HALS).

Polyvinyl butyral is a copolymer constructed from saturated units, that is to say it contains olefinic or aromatic bonds only as flaws and for this reason also demonstrates no significant absorption in the wavelength range from 280-380 nm (UV-A+UV-B). Moreover, in most cases PVB is plasticised using non-aromatic plasticisers for which the same applies regarding UV absorption. As a result, a relatively high inherent UV stability is achieved when films are made from a mixture consisting of PVB and plasticiser. The stability is further increased if the film is protected from the particularly harmful UV-B component of UV radiation by a mineral glass placed over the top of it.

Nonetheless, standard commercial PVB film for automotive and architectural glass applications is regularly furnished with UV absorbers, particularly with derivatives of benzotriazole, as an additive. The reasons for this are twofold: firstly, additional filtering of more harmful UV-A and UV-B radiation by means of the PVB film located in the middle of the laminated safety glass is desired as a functional characteristic above and beyond the safety properties of the laminated safety glass, since it offers a simple way to protect materials located behind the glass from overexposure to light and damage. Examples of this are displays behind a in a laminated safety glass shop window or the instrument panel beam below a windscreen in an automobile. Secondly, depending on the quality of the raw materials, polyvinyl alcohol or butyraldehyde, and the process control during synthesis and conditioning, PVB may contain flaws or contaminations that impair its UV stability. Moreover, additives that are added to the film formulation, such as colouring agents or phenolic antioxidants, may be sensitive to UV, so that it is practical to protect them by using a UV absorber.

In order to encapsulate photosensitive layers in photovoltaic modules, it is usual to use PVB- or EVA-based materials. UV absorbers are also added to these encapsulation films for the production process reasons described earlier. In this way, the UV radiation is entirely or partially absorbed. While this protects the photosensitive layer system of the photovoltaic module against radiation damage, it also reduces the radiation component that is usable by the photosensitive layers.

Thus, PVB films that are used commercially as encapsulating materials contain UV absorbers of the benzotriazole type (such as Tinuvin 328) and have a UV transmission of less than 0.5% in the wavelength range from 280-380 nm in the laminate between 2×2 mm white glass, measured according to EN 410. Similarly, EVA-based encapsulation films contain UV absorbers to protect them, and therefore have similarly low transmission values for UV radiation. Accordingly, no radiation is transmitted below the 380 nm wavelength when standard PVB films or EVA are used to generate a photocurrent.

Technical Object

The technical object of the present invention was to increase the UV transmission for encapsulation films in photovoltaic modules so as to improve the photocurrent yield of photovoltaic modules while altering their construction as little as possible.

Surprisingly, it was found that polyvinyl acetal film containing plasticisers may be rendered photostable in such a way as to enable high UV transmission while retaining good photochemical stability. This enables the photocurrent yield of photovoltaic modules to be increased significantly.

Illustration of the Invention

The object of the present invention is therefore a photovoltaic module comprising a laminate made from
 a) a transparent front cover
 b) one or more photosensitive semiconductor layers
 c) at least one polyvinyl acetal-based film containing a plasticiser, and
 d) a rear cover, wherein the polyvinyl acetal-based film containing a plasticiser has a UV transmission of more than 35% measured according to EN 410 in the laminate between two panes of white glass having a thickness of 2 mm.

According to EN 410, UV transmission is determined in the wavelength range from 280-380 nm.

Preferably, photosensitive semiconductor layers that absorb radiation in this wavelength range and can convert it to electrical energy are used. This is achieved in "tandem cells" by means of layers having a basis of gallium arsenide/germanium-, gallium-indium-arsenide- or gallium-indium-phosphide, among others.

It is particularly advantageous if the films according to the invention are used for solar cells that respond specifically to UV radiation, or modules containing such cells, and which are otherwise transparent in the visible range of the spectrum. Such systems are currently under development and they are planned to be used in the future as transparent glass panels that filter out the harmful UV component of the spectrum while still using it to generate photocurrent.

Films used according to the invention preferably have a UV transmission greater than 50%, particularly preferably more than 70%, measured according to EN 410 in the laminate between two panes of white glass having a thickness of 2 mm.

This can be achieved if the films c) contain essentially no UV absorbers, that is to say the concentration thereof is less than 0.01% by weight, preferably less than 0.001%, particularly preferably is equal to 0% by weight, relative to the film mixture in each case.

Adequate UV stability of the films used according to the invention may be achieved by appropriate selection of the polyvinyl alcohol (PVA) for producing the polyvinyl acetal. If unsaturated units are already present as defects in the polymer chain at the PVA stage, they will necessarily also be present in the polyvinyl acetal that is produced from it, and will thus impair the light stability and UV transmission thereof. At the PVA stage, the unsaturated units may be present in the form of double bonds that are isolated or conjugate with one another or conjugate with carbonyl bonds. These unsaturated units in the PVA can be detected by UV spectroscopy.

If very high defect proportions are present, they lead to extinctions of almost 1 at 280 nm when the PVA is measured as a 4% by weight solution in $H_2O$. In order to produce polyvinyl acetal for use according to the invention, a polyvinyl alcohol is therefore used that has extinction values at 280 nm of less than 0.5, less than 0.3, particularly less than 0.2 and preferably less than 0.1 in a 4% by weight aqueous solution.

A further object of the present invention are therefore polyvinyl acetal-based films containing plasticiser, wherein the polyvinyl acetal is produced by acid-catalysed acetalisation of polyvinyl alcohol, and this polyvinyl alcohol has extinction values of less than 0.5 in a 4% by weight aqueous solution.

In practice, a polyvinyl acetal may be produced as the basic starter material for an encapsulation film under optimised conditions, but it is still not possible to entirely prevent the occurrence of defects along or at the ends of the polymer chains. Therefore, it may be helpful to add selected light stabilisers to the polyvinyl acetal or the film mixture and not to include UV absorbers.

Alternatively or in addition to largely avoiding the use of UV absorbers and/or the use of PVB with particularly low defect incidence, the films used according to the invention may be furnished with one or more non-aromatic light stabilisers, particularly with sterically hindered (non-aromatic) HALS-type amines and/or sterically hindered (non-aromatic) aminoethers (NOR-HALS). By using only non-aromatic products it is ensured that the transmission of the film is not unnecessarily impaired in the 280-380 nm UV range.

Films used according to the invention preferably contain 0.005-1% by weight, particularly preferably 0.01-0.5% by weight, especially 0.05-0.3% by weight and most preferably 0.10-0.25% by weight non-aromatic light stabilisers such as sterically hindered amines of the HALS or NOR-HALS type.

A further object of the present invention are therefore polyvinyl acetal-based films containing plasticiser, wherein they contain essentially no aromatic UV absorbers and 0.005 to 1% by weight sterically hindered amines (HALS) and/or sterically hindered aminoethers (NOR-HALS).

Particularly suitable amine are sterically hindered amines having the general formulas I, II and or III

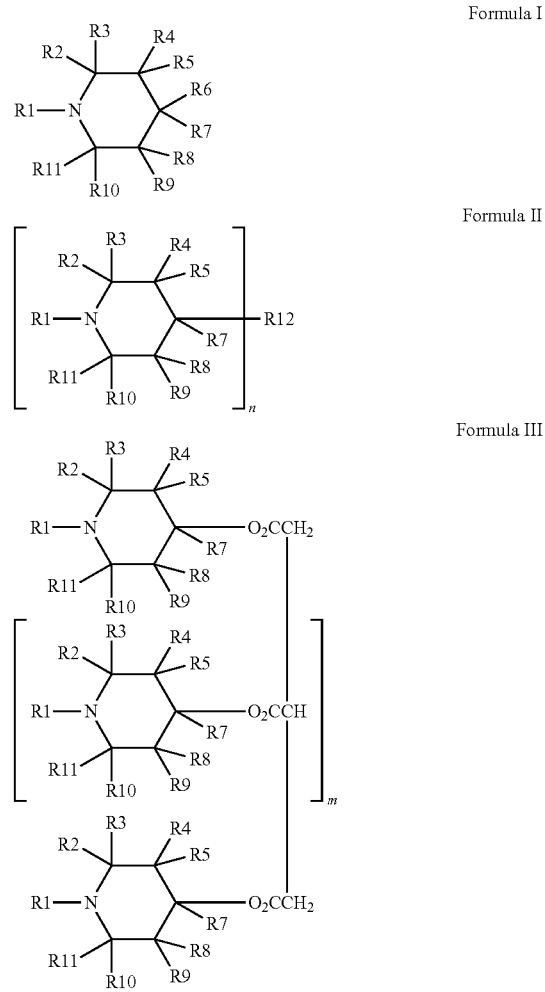

where R1, R2, R3, R4, R5, R6, R7, R8, R9, R10, R11=non-aromatic substituents such as H, C1-C20 alkyl, hydroxyalkyl, alkoxyalkyl, acyloxyalkyl, each unsubstituted or substituted by aldehyde-, keto- or epoxide groups, R12=smooth compound, C1-C20 alkyl, hydroxyalkyl, alkoxyalkyl, acyloxyalkyl, each unsubstituted or substituted by aldehyde-, keto- or epoxide groups n=2-4 m=1-10.

Compounds of this type are available commercially, for example in the products Tinuvin 123 (NOR-HALS), Tinuvin 144, Tinuvin 622, Tinuvin 770 manufactured by Ciba Specialities. ADK Stab LA-57, LA-52 or LA-62 manufactured by Asai Denka Co. or UVINUL 4050 H from BASF AG for example are particularly suitable. Sanduvor PR-31 or Chimasorb 119 are less suitable because of the proportion of unsaturated molecules they contain (Sanduvor PR-31: anisol radical; Chimasorb 119: triazine ring), which result in excessively high absorption in the UV range.

To produce polyvinyl acetal, polyvinyl alcohol is dissolved in water and acetalated with an aldehyde, such as butyraldehyde, formaldehyde or propionaldehyde with the addition of an acid catalyst. The precipitated polyvinyl acetal is separated off, washed neutrally, suspended in a an aqueous, alkali-adjusted medium, then washed neutrally again and dried.

After the reaction, the acid used for acetalisation must be neutralised again. One way to obtain a low content of alkali metal ions when preparing the polyvinyl acetal is to omit the sodium or potassium hydroxides or carbonates normally used to neutralise the catalyst, or to thoroughly wash the polyvinyl acetal obtained in the acetalisation. Alternatively to the bases NaOH or KOH, the catalyst acid from the acetalisation step may also be neutralised by injecting carbon dioxide or ethylene oxide, for example.

The polyvinyl alcohol content of the polyvinyl acetal can be adjusted by altering the quantity of the aldehyde used for the acetalisation.

It is also possible to perform the acetalisation with other or multiple aldehydes having 2-10 carbon atoms (for example valeraldehyde).

The films based on plasticiser-containing polyvinyl acetal preferably contain uncrosslinked polyvinyl butyral (PVB), which is obtained by acetalisation of polyvinyl alcohol with butyraldehyde.

The use of crosslinked polyvinyl acetals, particularly crosslinked polyvinyl butyral (PVB) is also possible. Suitable crosslinked polyvinyl acetals are described for example in EP 1527107 B1 and WO 2004/063231 A1 (thermal self-crosslinking of carboxyl group-containing polyvinyl acetals), EP 1606325 A1 (polyvinyl acetals crosslinked with polyaldehydes) and WO 03/020776 A1 (polyvinyl acetals crosslinked with glyoxylic acid). The disclosures of the patent applications cited above are included in the present description by reference in their entirety.

Within the scope of the present invention, terpolymers of hydrolysed vinyl acetate/ethylene copolymers may be used as the polyvinyl alcohol. These compounds are usually more than 98 Mol % hydrolysed and contain 1 to 10 ethylene-based weight units (for example the "Exceval" type manufactured by Kuraray Europe GmbH).

Also within the scope of the present invention, hydrolysed copolymers of vinyl acetate and at least one additional ethylene-saturated monomer may also be used as the polyvinyl alcohol.

The polyvinyl alcohols may be used within the scope of the present invention pure or as a mixture of polyvinyl alcohols having varying degrees of polymerisation or hydrolysis.

Besides the acetal units, polyvinyl acetals also contain units that result from vinyl acetate and vinyl alcohol. The polyvinyl acetals used according to the invention preferably have a polyvinyl alcohol component of less than 22% by weight, 20% by weight or 18% by weight, less than 16% by weight or 15% by weight, and particularly less than 14% by weight. The polyvinyl alcohol component should not be less than 12% by weight.

The polyvinyl acetate content of the polyvinyl acetal used according to the invention is preferably less than 5% by weight, less than 3% by weight or less than 1% by weight, particularly preferably less than 0.75% by weight, more preferably less than 0.5% by weight and especially less than 0.25% by weight.

The degree of acetalisation may be determined arithmetically from the polyvinyl alcohol component and the residual actetate content.

The films preferably have plasticiser content not exceeding 40% by weight, 35% by weight, 32% by weight, 30% by weight, 28% by weight, 26% by weight, 24% by weight, 22% by weight, 20% by weight, 18% by weight, 16% by weight, (relative to the formulation for the entire film in each case) and the plasticiser content should not be less than 15% by weight for reasons of processability of the film. Films and photovoltaic modules according to the invention may contain one or more plasticisers.

In general, plasticisers that are suitable for the films used according to the invention are one or more compounds selected from the following groups:

Esters of polyvalent aliphatic or aromatic acids, for example dialkyl adipates such as dihexyl adipate, dioctyl adipate, hexylcyclohexyl adipate, mixtures of heptyl and nonyl adipates, diisononyl adipate, heptylnonyl adipate, and esters of adipic acid with cycloaliphatic ester alcohols or ester alcohols containing ether bonds, dialkyl sebacates such as dibutyl sebacate and esters of sebacic acid with cycloaliphatic ester alcohols or ester alcohols containing ether bonds, esters of phthalic acid such as butylbenzyl phthalate or bis-2-butoxyethyl phthalate Esters or ethers of polyvalent aliphatic or aromatic alcohols or oligoether glycols with one or more unbranched or branched aliphatic or aromatic substituents, such as esters of di-, tri- or tetraglycols with linear or branched aliphatic or cycloaliphatic carboxylic acids; as examples of this last group may be cited diethylene glycol-bis-(2-ethylhexanoate), triethylene glycol-bis-(2-ethylhexanoate), triethylene glycol-bis-(2-ethylbutanoate), tetraethylene glycol-bis-n-heptanoate, triethylene glycol-bis-n-heptanoate, triethylene glycol-bis-n-hexanoate, tetraethylene glycol dimethyl ether and/or dipropylene glycol benzoate Phosphates with aliphatic or aromatic ester alcohols such as tris(2-ethylhexyl)phosphate (TOF), triethyl phosphate, diphenyl-2-ethylhexyl phosphate, and/or tricresyl phosphate Esters of citric acid, succinic acid, and/or fumaric acid.

Plasticisers well suited for the films used according to the invention are one or more compounds selected from the following group: di-2-ethylhexyl sebacate (DOS), di-2-ethylhexyl adipate (DOA), dihexyl adipate (DHA), dibutyl sebacate (DBS), triethylene glycol-bis-n-heptanoate (3G7), tetraethylene glycol-bis-n-heptanoate (4G7), triethylene glycol-bis-2-ethyl hexanoate (3GO and 3G8) tetraethylene glycol-bis-n-2-ethyl hexanoate (4GO and 4G8), di-2-butoxyethyl adipate (DBEA), di-2-butoxyethoxyethyl adipate (DBEEA), di-2-butoxyethyl sebacate (DBES), di-2-ethylhexyl phthalate (DOP), di-isononyl phthalate (DINP), triethylene glycol-bis-isononanoate, triethylene glycol-bis-2-propyl hexanoate, tris(2-ethylhexyl)phosphate (TOF), 1,2-cyclohexane dicarboxylic acid diisononyl ester (DINCH) and dipropylene glycol benzoate.

Most particularly suitable for use as plasticisers for the films used according to the invention are plasticisers whose polarity, expressed by the formula $100 \times O/(C+H)$ is less than/equal to 9.4, where O, C and H stand respectively for the number of oxygen, carbon and hydrogen atoms in the respective molecule. The following table 1 lists plasticisers that may be used according to the invention together with their polarity values according to the formula $100 \times O/(C+H)$.

TABLE 1

| Name | Polarity value |
| --- | --- |
| Di-2-ethylhexyl sebacate (DOS) | 5.3 |
| Diisononyl cyclohexane dicarboxylic acid ester (DINCH) | 5.4 |
| Di-2-ethylhexyl adipate (DOA) | 6.3 |
| Di-2-ethylhexyl phthalate (DOP) | 6.5 |
| Dihexyl adipate (DHA) | 7.7 |
| Dibutyl sebacate (DBS) | 7.7 |
| Triethylene glycol-bis-2-propyl hexanoate | 8.6 |
| Triethylene glycol-bis-i-nonanoate | 8.6 |

TABLE 1-continued

| Name | Polarity value |
| --- | --- |
| Di-2-butoxyethyl sebacate (DBES) | 9.4 |
| Triethylene glycol-bis-2-ethyl hexanoate (3G8) | 9.4 |

The film c) used according to the invention preferably contains more than 10 ppm, preferably more than 20 ppm, preferably more than 30 ppm, preferably more than 50 ppm, preferably more than 75 ppm, preferably more than 100 ppm, preferably more than 125 ppm a particularly preferably more than 150 ppm ions selected from the group of alkaline earth metals (Be, Mg, Ca, Sr, Ba, Ra), zinc and aluminium. To avoid undesirable cloudiness, on the other hand, it should not contain more than 1000 ppm of these polyvalent metals.

At the same time, the content of alkali metal ions (Li, Na, K, Rb, Cs, Fr) in the plasticiser-containing polyvinyl acetal-based film should be adjusted as low as possible. The film preferably contains less than 150 ppm, preferably less than 100 ppm, preferably less than 75 ppm, preferably less than 50 ppm, preferably less than 25 ppm, preferably less than 10 ppm, and particularly preferably less than 5 ppm alkali metal ions.

The respective alkaline earth metal, zinc, aluminium, and alkali metal ions are present in the film as salts or monovalent or polyvalent inorganic or monovalent or polyvalent organic acids. Examples of gegenions are for example salts of organic carboxylic acids such as formiates, acetates, trifluoroacetates, propionates, butyrates, benzoates, 2-ethylhexanoates and so on, wherein carboxylic acids having fewer than 10 C atoms, preferably fewer than 8, preferably fewer than 6, preferably fewer than 4, and particularly preferably fewer than 3 C atoms are particularly preferred. Examples of inorganic gegenions are chlorides, nitrates, sulphates, phosphates.

The films used according to the invention preferably have a specific resistance of at least 1E+11 ohm*cm, preferably at least 5E+11 ohm*cm, preferably 1E+12 ohm*cm, preferably 5E+12 ohm*cm, preferably 1E+13, preferably 5E+13 ohm*cm, preferably 1E+14 ohm*cm in ambient moisture of 85% rH at 23° C.

In addition, the ion mobility, which may depend on the water content of the film, and thus also the specific resistance, may be adjusted by adding silicic acid, particularly fumed $SiO_2$. The plasticiser-containing, polyvinyl acetal-based films preferably contain 0.001 to 15% by weight, preferably 0.01 to 10% by weight and particularly 2 to 5% by weight $SiO_2$.

Moreover, the films according to the invention may also contain standard additives, such as oxidation stabilisers, colouring agents, pigments and releasing agents provided these do not impair the UV transmission.

The production and composition of polyvinyl acetal-based films is described theoretically for example in EP 185 863 B1, EP 1 118 258 B1 WO 02/102591 A1, EP 1 118 258 B1 or EP 387 148 B1.

The photovoltaic modules may be manufactured by laminating the transparent front cover a), the photosensitive semiconductor layers b), and the rear cover d) using at least one plasticiser-containing, polyvinyl acetal-based film c) by melting the films so that the photosensitive semiconductor layers are completely enclosed inside a bubble- and streak-free laminate.

In this variant of the photovoltaic modules according to the invention, the photosensitive semiconductor layers b) are embedded between two films c) and bonded to both the transparent front cover a) and the rear cover d).

Particularly in thin-film solar modules, the photosensitive semiconductor layer is deposited directly on a support (for example by evaporation coating, gas phase deposition, sputtering, or wet deposition). Encapsulation is not possible in this case. In an inventive module of such kind, therefore, one or more photosensitive semiconductor layer(s) b) is/are deposited on a transparent front cover a) or a rear cover d) and bonded to one another using at least one plasticiser-containing, polyvinyl acetal-based film c).

Usually in thin-film modules, the photosensitive semiconductor layer is deposited on the support so as to be contact with the entire surface thereof, that is to say up to the edge of the support. Then, a portion of the photosensitive semiconductor layer is removed again, so that a border area without any semiconductor is left for insulation purposes (this process is called edge coating removal). Because of the high resistance values of the film used according to the invention, this edge area may preferably be less than 3 cm wide, particularly preferably less than 2 cm wide, and especially less than 1 cm wide.

During the lamination process, films used according to the invention fill in the cavities on the photosensitive semiconductor layers and their electrical connectors.

The thickness of the plasticiser-containing, polyvinyl acetal-based films is usually 0.38, 0.51, 0.76, 1.14, 1.52 or 2.28 mm.

The transparent front cover a) is usually made from glass or PMMA. The rear cover d) of the photovoltaic module according to the invention may be made from glass, plastic or metal or composites thereof, and at least one of the supports may be transparent. It is also possible to construct one or both covers from laminated glass (that is to say as a laminate of at least two glass panels and at least one PVB film) or as an insulating glass panel with a gas-filled space. Of course, these variants may also be used in any combination.

The photosensitive semiconductor layers used in the modules do not have to exhibit any particular properties. Mono- or polycrystalline or amorphous systems may be used.

In order to laminate the layered body obtained in this manner, any of the processes familiar to those skilled in the art may be used, with or without preparation of a pre-nip.

Autoclave processes are carried out under elevated pressure of about 10 to 15 bar and at temperatures from 130 to 145° C. for approximately 2 hours. Vacuum bag or vacuum ring methods, as described for example in EP 1 235 683 B1, function at about 200 mbar and 130 to 145° C.

Vacuum laminators are used for preference to produce the photovoltaic modules according to the invention. These consist of a chamber that can be heated and evacuated, and in which laminated glass panels can be laminated within 30-60 minutes. Partial vacuums from 0.01 to 300 mbar and temperatures from 100 to 200° C., particularly 130-160° C. have proven most effective in practice.

Alternatively, a layered body assembled as described in the preceding may be compressed between at least one pair of rollers at a temperature of 60 to 150° C. to produce a module according to the invention. Systems of such kind for producing laminated glass panes are known and are normally equipped with at least one heater tunnel before and/or after the first press in systems with two presses.

A further object of the invention is the use of plasticiser-containing, polyvinyl acetal-based films having a UV transmission or more than 35%, determined according to EN 410 between two panes of white glass having a thickness of 2 mm, in the manufacture of photovoltaic modules.

Photovoltaic modules according to the invention may be used as façade elements, roof surfaces, conservatory paneling, acoustic barriers, balcony or curtain wall panels, or as elements in glazed surfaces.

Measurement Methods:

The volume resistivity of the film is measured in accordance with DIN IEC 60093 at defined temperature and ambient humidity (23° C. and 85% rLF) after the film has been conditioned in this atmosphere for at least 24 hours. A type 302 132 plate electrode made by Fetronic GmbH and an ISO-Digi 5 kV ohmmeter made by Amprobe were used to take the measurement. The test voltage was 2.5 kV, the hold time after the test voltage was applied until the measured value was recorded was 60 seconds. To ensure good contact between the flat plates of the measuring electrode and the film, the surface roughness $R_z$ thereof should not be greater than 10 mm for a measurement according to DIN EN ISO 4287, which means that it may be necessary to smooth the original surface of the PVB film by thermal recoining before taking a resistance measurement.

The polyvinyl alcohol and polyvinyl alcohol acetate content of the polyvinyl acetals was determined in accordance with ASTM D 1396-92. The metal ion content was analysed by means of atomic absorption spectroscopy (AAS). The water or moisture content of the films is determined using the Karl-Fischer method.

In order to determine the UV absorption of the polyvinyl alcohol used in the acetalisation, it is measured in a UV/VIS spectrometer, for example a Perkin-Elmer Lambda 910, as a 4% aqueous solution in a layer thickness of 1 cm at wavelength 280 nm. The measurement value must be relative to the dry material content of the PVA.

EXAMPLES

Films with a thickness of 0.76 mm were produced with the mixtures of the compositions listed in the following tables and examined for light (380-780 nm) and UV transmission (280-380 nm) as laminate between 2 panes of white glass (Optiwhite), each 2 mm thick, in accordance with EN 410. Electrical volume resistivity was determined as described above after the film samples have been conditioned for an adequate period in an atmosphere of 23° C./85% relative humidity. The occurrence of bubbles or delamination due to UV damage was examined on laminates with dimensions 10×10 cm (2×2 mm Optiwhite glass) after 20 weeks' storage in a radiation chamber in accordance with EN 12543, though the conditions in the chamber differed from those described for EN 12543, in that test temperatures of about 80° C. prevailed. Films that exhibit bubbles on more than 5% their surface area are unusable.

It was revealed that films according to the invention present both high UV transmission and good stability in radiation testing. Films of such kind are suitable for use in photovoltaic applications, since they increase the photocurrent yield by about 1% in the range from 280 bis 380 nm, particularly when blue-sensitive solar cells are used.

TABLE 2

|  | Example | | | | |
| --- | --- | --- | --- | --- | --- |
|  | 1 | 2 | 3 | 4 | 5 |
| PVB | 76 | 76 | 76 | 76 | 76 |
| PVOH content of PVB | 20.00 | 20.00 | 20.00 | 20.00 | 20.00 |
| UV absorption PVA (1) | 0.10 | 0.06 | 0.10 | 0.10 | 0.10 |
| 3G8 plasticiser | 24 | 24 | 24 | 24 | 24 |
| DINCH plasticiser | — | — | — | — | — |
| Tinuvin 328 (2) | — | — | — | — | — |
| Tinuvin 770 DF (3) | — | — | — | 0.15 | 0.3 |
| ADK STAB LA-62 (4) | — | — | 0.15 | — | — |
| Sanduvor PR-31 (5) | — | — | — | — | — |
| Translucence TL [EN410] (6) | 90.5 | 91.2 | 90.8 | 91.3 | 90.1 |
| Degree of UV transmission (280-380 nm) (6) | 71.80 | 72.00 | 63.40 | 73.50 | 72.50 |
| Radiation test (7) | 4% | 1% | 1% | 0% | 0% |
| Volume resistivity (8) | 3.0E+11 | 3.0E+11 | 3.0E+11 | 3.0E+11 | 3.0E+11 |

TABLE 3

|  | Example | | | | |
| --- | --- | --- | --- | --- | --- |
|  | 6 | 7 | 8 | 9 | 10 |
| PVB | 76 | 74 | 76 | 74 | 78 |
| PVOH content of PVB | 14.30 | 14.30 | 14.30 | 14.30 | 14.30 |
| UV absorption PVA (1) | 0.10 | 0.10 | 0.10 | 0.10 | 0.10 |
| 3G8 plasticiser | 24 | — | 24 | — | — |
| DINCH plasticiser | — | 26 | — | 26 | 22 |
| Tinuvin 328 (2) | — | — | — | — | — |
| Tinuvin 770 DF (3) | — | — | 0.1 | 0.1 | 0.1 |
| ADK STAB LA-62 (4) | — | — | — | — | — |
| Sanduvor PR-31 (5) | — | — | — | — | — |
| Translucence TL [EN410] (6) | 91 | 91.1 | 90.7 | 91 | 90.4 |
| Degree of UV transmission (280-380 nm) (6) | 70.20 | 73.00 | 70.20 | 71.80 | 73.40 |

TABLE 3-continued

| | Example | | | | |
|---|---|---|---|---|---|
| | 6 | 7 | 8 | 9 | 10 |
| Radiation test (7) | 1% | 1% | 0% | 0% | 0% |
| Volume resistivity (8) | 1.5E+12 | 1.00E+14 | 1.5E+12 | 1.00E+14 | >3.5E+14 |

TABLE 4

| | Example | | | | | |
|---|---|---|---|---|---|---|
| | VG1 | VG2 | VG3 | VG4 | VG5 | VG6 |
| PVB | 76 | 76 | 76 | 76 | 76 | 76 |
| PVOH content of PVB | 20.00 | 20.00 | 20.00 | 20.00 | 20.00 | 20.00 |
| UV absorption PVA (1) | 0.82 | 0.10 | 0.10 | 0.64 | 0.10 | 0.10 |
| 3G8 plasticiser | 24 | 24 | 24 | 24 | 24 | 24 |
| DINCH plasticiser | — | — | — | — | — | — |
| Tinuvin 328 (2) | — | 0.05 | 0.15 | 0.15 | 0.3 | — |
| Tinuvin 770 DF (3) | — | — | — | — | — | — |
| ADK STAB LA-62 (4) | — | — | — | — | — | — |
| Sanduvor PR-31 (5) | — | — | — | — | — | 0.15 |
| Translucence TL [EN410] (6) | 87.4 | 90.5 | 90.7 | 88.4 | 91.2 | 90.6 |
| Degree of UV transmission (280-380 nm) (6) | 62.50 | 5.94 | 0.23 | 0.15 | 0.03 | 5.00 |
| Radiation test (7) | 15% | 0% | 0% | 0% | 0% | 0% |
| Volume resistivity (8) | 3.0E+11 | 3.0E+11 | 3.0E+11 | 3.0E+11 | 3.0E+11 | 3.0E+11 |

All values given in the tables are in % by weight relative to the total of PVB+plasticiser in the film mixture. Key:
3G8 Triethylene glycol-bis-2-ethyl hexanoate
DINCH 1,2-cyclohexane dicarboxylic acid diisononyl ester
PVB Polyvinyl butyral with the specified PVA content
(1) Extinction value of a 4% by weight aqueous solution at 280 nm
(2) Benzotrizole type UV absorber (Ciba Specialities)
(3) HALS without unsaturated component (Ciba Specialities)
(4) HALS without unsaturated component (Asahi-Denka)
(5) HALS with unsaturated component (Clariant)
(6) determined on 0.76 mm film laminated between 2 panes of 2 mm thick Optiwhite glass (Pilkington)
(7) Fraction of surface on which bubbles and/or deleminations occur at a distance of more than 1 cm from the edge of the laminate following radiation test in accordance with EN 12543 (80° C.)
(8) Determined in accordance with DIN IEC 60093 at 23° C./85% rH with a test voltage of 2500V in [Ohm*cm].

The invention claimed is:

1. A photovoltaic module, comprising a laminate made from
a) a transparent front cover,
b) one or more photosensitive semiconductor layers,
c) at least one plasticiser-containing, polyvinyl acetal-based film, and
d) a rear cover,
wherein the plasticiser-containing, polyvinyl acetal-based film c) has a UV transmission at 280 to 380 nm greater than 35%, determined between two panels of white glass, each 2 mm thick in accordance with EN410; and
wherein the plasticiser-containing, polyvinyl acetal-based film contains, relative to the overall film mixture in each case, less than 0.01% by weight aromatic UV absorbers, and 0.005 to 1% by weight sterically hindered amines (HALS) and/or sterically hindered aminoethers (NOR-HALS) as non-aromatic photoprotection agents.

2. The photovoltaic module as recited in claim 1, wherein the polyvinyl acetal is produced by acetalization of polyvinyl alcohol, which has an extinction of less than 0.5 at 280 nm and in a 4% by weight aqueous solution having a layer thickness of 1 cm.

3. The photovoltaic module as recited in claim 1, wherein the polyvinyl acetal-based film c) is essentially free of UV absorbers.

4. The photovoltaic module as recited in claim 1 wherein the plasticiser-containing, polyvinyl acetal-based film contains more than 10 ppm metal ions selected from alkali earth metals, zinc and aluminium and less than 150 ppm alkali metal ions.

5. The photovoltaic module as recited in claim 1 wherein the plasticiser-containing, polyvinyl acetal-based films c) have a volume resistivity of at least 1E11 Ohm*cm in an ambient climate of 85% rH/23° C.

6. A plasticiser-containing, polyvinyl acetal-based film, wherein said film contains, relative to the overall film mixture in each case, less than 0.01% by weight aromatic UV absorbers, and 0.005 to 1% by weight sterically hindered amines (HALS) and/or sterically hindered aminoethers (NOR-HALS) as non-aromatic photoprotection agents.

7. A plasticiser-containing, polyvinyl acetal-based film according to claim 6, wherein said film has a UV transmission at 280 to 380 nm greater than 35%, determined between two panels of white glass, each 2 mm thick in accordance with EN410.

8. A plasticiser-containing, polyvinyl acetal-based film according to claim 6, wherein said film has a UV transmission at 280 to 380 nm greater than 50%, determined between two panels of white glass, each 2 mm thick in accordance with EN410.

9. A plasticiser-containing, polyvinyl acetal-based film according to claim 6, wherein said film contains less than 0.001% by weight aromatic UV absorbers, relative to the overall film mixture.

10. A plasticiser-containing, polyvinyl acetal-based film according to claim 6, wherein the polyvinyl acetals of the film have a polyvinyl alcohol content of less than 22% by weight bur not less than 12% by weight, and a polyvinyl acetate content of less than 5% by weight.

11. A plasticiser-containing, polyvinyl acetal-based film according to claim 6, wherein the polyvinyl acetals of the film have a polyvinyl alcohol content of less than 16% by weight bur not less than 12% by weight, and a polyvinyl acetate content of less than 1% by weight.

12. A plasticiser-containing, polyvinyl acetal-based film according to claim 6, wherein said film has a plasticiser content not exceeding 40% by weight and not less than 15% by weight, relative to the overall film mixture.

13. A plasticiser-containing, polyvinyl acetal-based film according to claim 6, wherein said film has a plasticiser content not exceeding 30% by weight and not less than 15% by weight, relative to the overall film mixture.

14. A plasticiser-containing, polyvinyl acetal-based film according to claim 6, wherein said film has a specific resistance of at least 1E+11 ohm*cm in ambient moisture of 85% rH at 23° C.

15. A plasticiser-containing, polyvinyl acetal-based film according to claim 6, wherein said film has a specific resistance of 5E+11 ohm*cm in ambient moisture of 85% rH at 23° C.

16. A plasticiser-containing, polyvinyl acetal-based film according to claim 6, wherein said film contains 0.001 to 15% by weight $SiO_2$.

17. A plasticiser-containing, polyvinyl acetal-based film according to claim 6, wherein said film contains 2 to 5% by weight $SiO_2$.

18. A plasticiser-containing, polyvinyl acetal-based film,
wherein said film has a UV transmission at 280 to 360 nm greater than 35%, determined between two panels of white glass, each 2 mm thick in accordance with EN410; and
wherein the plasticiser-containing, polyvinyl acetal-based film contains, relative to the overall film mixture in each case, less than 0.01% by weight aromatic UV absorbers, and 0.005 to 1% by weight sterically hindered amines (HALS) and/or sterically hindered aminoethers (NOR-HALS) as non-aromatic photoprotection agents.

* * * * *